US012563928B2

(12) United States Patent
Wang et al.

(10) Patent No.: US 12,563,928 B2
(45) Date of Patent: Feb. 24, 2026

(54) DISPLAY SUBSTRATE AND ELECTRONIC DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wei Wang, Beijing (CN); Yi Zhang, Beijing (CN); Shun Zhang, Beijing (CN); Yuanqi Zhang, Beijing (CN); Ping Wen, Beijing (CN); Yu Wang, Beijing (CN); Yang Zeng, Beijing (CN); Tianci Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 467 days.

(21) Appl. No.: 18/254,521

(22) PCT Filed: Dec. 2, 2021

(86) PCT No.: PCT/CN2021/135036
§ 371 (c)(1),
(2) Date: May 25, 2023

(87) PCT Pub. No.: WO2023/097599
PCT Pub. Date: Jun. 8, 2023

(65) Prior Publication Data
US 2024/0373689 A1      Nov. 7, 2024

(51) Int. Cl.
*H10K 59/131* (2023.01)
*H10K 59/40* (2023.01)

(52) U.S. Cl.
CPC ........... *H10K 59/131* (2023.02); *H10K 59/40* (2023.02)

(58) Field of Classification Search
None
See application file for complete search history.

(56) References Cited

U.S. PATENT DOCUMENTS 6,750,836 B1 *   6/2004   Katayama ......... G02F 1/136277
                                                    349/110
2019/0123114 A1   4/2019   Park et al.
(Continued)

FOREIGN PATENT DOCUMENTS

CN      108447872 A      8/2018
CN      109585461 A      4/2019
(Continued)

*Primary Examiner* — Kyoung Lee
(74) *Attorney, Agent, or Firm* — LEASON ELLIS LLP

(57)                     ABSTRACT
A display substrate and an electronic device are provided. The display substrate includes a base substrate, an insulating layer, and a conductive layer; the conductive layer is on a side of the insulating layer away from the base substrate; the insulating layer includes at least one concave portion; the conductive layer includes a first signal line and a second signal line which are adjacent to each other and arranged side by side; the first signal line and the second signal line are spaced apart and insulated from each other; the first signal line includes a first overlapping portion overlapping with the concave portion in a direction perpendicular to the base substrate; and a distance between the first overlapping portion and the second signal line is greater than or equal to a preset distance being greater than or equal to ½ of a line width of the first overlapping portion.

20 Claims, 6 Drawing Sheets

(56)                  References Cited

U.S. PATENT DOCUMENTS

2020/0150725  A1      5/2020  Saitoh et al.
2021/0358956  A1     11/2021  Ma
2021/0384226  A1     12/2021  Xin et al.

FOREIGN PATENT DOCUMENTS

CN          109698219  A      4/2019
CN          110085552  A      8/2019
CN          113345923  A      9/2021

* cited by examiner

DISPLAY SUBSTRATE AND ELECTRONIC DEVICE

CROSS-REFERENCE TO RELATED PATENT APPLICATIONS

This application is a U.S. National Stage Application under 35 U.S.C. § 371 of International Patent Application No. PCT/CN2021/135036, filed Dec. 2, 2021, which is incorporated by reference in its entirety.

TECHNICAL FIELD

Embodiments of the present disclosure relate to a display substrate and an electronic device.

BACKGROUND

The user interface with touch function has been widely used in various electronic devices, such as display panels, display devices or other display products. At the same time, with the increasing demand of users for the visual effect of display products, the narrow frame or even full-screen display has become a new trend in the development of display products such as organic light-emitting diode (OLED) display products.

SUMMARY

At least an embodiment of the present disclosure provides a display substrate, and the display substrate comprises a base substrate, and an insulating layer and a conductive layer which are on the base substrate and stacked with each other; the conductive layer is on a side of the insulating layer away from the base substrate; the insulating layer comprises at least one concave portion extending along a first direction; the conductive layer comprises a plurality of signal lines, the plurality of signal lines comprise a first signal line and a second signal line which are adjacent to each other and arranged side by side, and the first signal line and the second signal line are spaced apart and insulated from each other; the first signal line comprises a first overlapping portion, and the first overlapping portion at least partially overlaps with the concave portion in a direction perpendicular to the base substrate; and a distance between the first overlapping portion and the second signal line is greater than or equal to a preset distance, and the preset distance is greater than or equal to ½ of a line width of the first overlapping portion.

For example, in the display substrate provided by an embodiment of the present disclosure, the preset distance is greater than or equal to 3 times a height of the concave portion in the direction perpendicular to the base substrate.

For example, in the display substrate provided by an embodiment of the present disclosure, the preset distance is greater than or equal to ½ of a width of the concave portion in a direction perpendicular to the first direction.

For example, in the display substrate provided by an embodiment of the present disclosure, a width of the concave portion in a direction perpendicular to the first direction ranges from 5 μm to 15 μm, a height of the concave portion in the direction perpendicular to the base substrate ranges from 1 μm to 3 μm, a drop angle of the concave portion in the direction perpendicular to the base substrate ranges from 30° to 50°, and the line width of the first overlapping portion ranges from 5 μm to 15 μm.

For example, in the display substrate provided by an embodiment of the present disclosure, in the direction perpendicular to the base substrate, the second signal line does not overlap with the concave portion.

For example, in the display substrate provided by an embodiment of the present disclosure, an orthographic projection of the first overlapping portion on the base substrate is within a region surrounded by an orthographic projection of the concave portion on the base substrate in a direction perpendicular to the first direction.

For example, in the display substrate provided by an embodiment of the present disclosure, the concave portion comprises a first edge and a second edge which are opposite to each other and respectively extend along the first direction; in the direction perpendicular to the base substrate, the first signal line overlaps with the first edge of the concave portion and does not overlap with the second edge of the concave portion; and an orthographic projection of the second signal line on the base substrate is on a side of an orthographic projection of the second edge on the base substrate away from an orthographic projection of the first edge on the base substrate.

For example, in the display substrate provided by an embodiment of the present disclosure, the first overlapping portion extends along the first direction.

For example, in the display substrate provided by an embodiment of the present disclosure, the first signal line further comprises a first main portion, the first main portion does not overlap with the concave portion in the direction perpendicular to the base substrate, and a distance between the first overlapping portion and the second signal line is greater than or equal to a distance between the first main portion and the second signal line.

For example, in the display substrate provided by an embodiment of the present disclosure, a line width of the first main portion is greater than the line width of the first overlapping portion.

For example, in the display substrate provided by an embodiment of the present disclosure, in the first signal line, the line width of the first main portion gradually decreases along a direction close to the first overlapping portion.

For example, in the display substrate provided by an embodiment of the present disclosure, the second signal line comprises a plurality of portions with different line widths to allow the distance between the first overlapping portion and the second signal line to be greater than the distance between the first main portion and the second signal line.

For example, in the display substrate provided by an embodiment of the present disclosure, the second signal line comprises a second overlapping portion and a second main portion, the second overlapping portion at least partially overlaps with the concave portion in the direction perpendicular to the base substrate, the second main portion does not overlap with the concave portion in the direction perpendicular to the base substrate, and a distance between the second overlapping portion and the first signal line is greater than or equal to a distance between the second main portion and the first signal line.

For example, in the display substrate provided by an embodiment of the present disclosure, a line width of the second main portion is greater than a line width of the second overlapping portion.

For example, in the display substrate provided by an embodiment of the present disclosure, in the second signal line, the line width of the second main portion gradually decreases along a direction close to the second overlapping portion.

For example, in the display substrate provided by an embodiment of the present disclosure, the first overlapping portion and the second overlapping portion respectively extend along a second direction different from the first direction.

For example, in the display substrate provided by an embodiment of the present disclosure, the at least one concave portion comprises a plurality of concave portions, and the first overlapping portion overlaps with the plurality of concave portions in the direction perpendicular to the base substrate.

For example, in the display substrate provided by an embodiment of the present disclosure, the display substrate comprises a functional region and a peripheral region at least partially surrounding the functional region, the first signal line and the second signal line are in the peripheral region and at least partially surround the functional region, and the first signal line and the second signal line are configured to transmit different electrical signals for the functional region, respectively.

For example, in the display substrate provided by an embodiment of the present disclosure, the functional region is configured to be a touch region, and the first signal line and the second signal line are configured to transmit a touch driving signal and a touch sensing signal for the touch region, respectively.

For example, in the display substrate provided by an embodiment of the present disclosure, the plurality of signal lines further comprise a third signal line, the third signal line and the first signal line are adjacent to each other and arranged side by side, and the third signal line is on a side of the first signal line away from the second signal line.

For example, in the display substrate provided by an embodiment of the present disclosure, the third signal line is on a side of the first signal line and the second signal line away from the functional region, and a distance between the first overlapping portion and the third signal line is greater than the distance between the first overlapping portion and the second signal line.

For example, in the display substrate provided by an embodiment of the present disclosure, the first signal line is on a side of the second signal line away from the functional region.

At least an embodiment of the present disclosure further provides an electronic device, and the electronic device comprises the display substrate according to any one of the embodiments of the present disclosure.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

Figure 1:
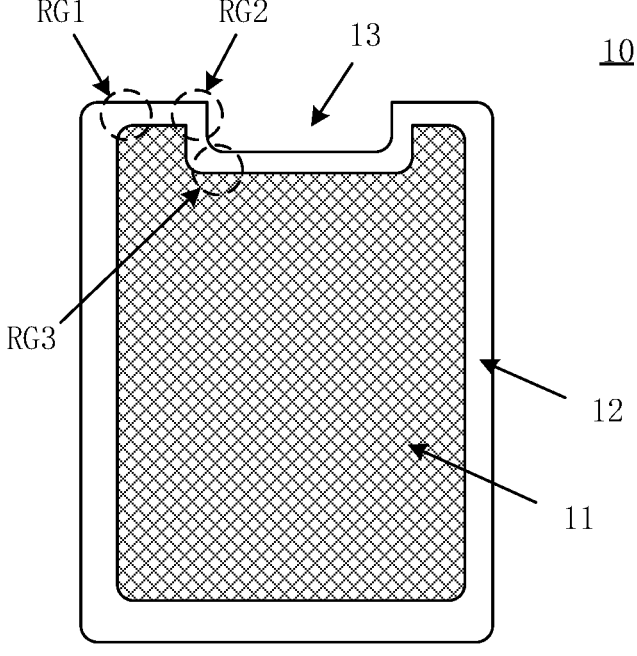
FIG. 1 is a schematic planar diagram of a display substrate provided by some embodiments of the present disclosure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not limited to a physical connection or mechanical connection, but may include an electrical connection, directly or indirectly. "On," "under," "right," "left," and the like are only used to indicate relative position relationship, and when the position of the object which is described is changed, the relative position relationship may be changed accordingly.

Organic light-emitting diode (OLED) display products have characteristics of self-illumination, high contrast, low energy consumption, wide viewing angle, fast response, being applicable for flexible panels, wide temperature range, simple manufacturing or the like, and therefore have broad development prospects. With the wide application of display products, the requirements of users for display products, such as in function and appearance, have been further increased. For example, in order to better improve the visual experience of users, display products usually need to meet the requirements of narrow frame design.

In the display products with narrow frame design, because of the small available space in the frame region, the wiring in the frame region usually needs to be arranged in a relatively dense manner, and the distance between adjacent lines may be relatively reduced. At the same time, in order to avoid adverse effects on the functional layers of such as display elements in the display region, organic film layers such as a pixel definition layer, a planarization layer, or the like in part region of the frame region are usually removed as far as possible to form a "groove" region, so that after encapsulation, the formed encapsulation layer can effectively prevent, for example, water vapor or oxygen from penetrating into the display region, such as the interior of display devices or other devices.

However, because of the large segment difference or drop that may be formed in the "groove" region, the flatness of the layer surface in the "groove" region is poor, and therefore when a conductive line or other conductive structures are formed in the "groove" region, adverse phenomena such as uneven etching or incomplete etching are easy to occur, resulting in a large number of residues of conductive substances such as metal. Since the distance between adjacent lines in the frame region may be relatively small, it leads to the risk of short circuit between adjacent lines due to the residues of conductive substances, which may cause seriously adverse effects on the signal transmission effect in the frame region.

At least one embodiment of the present disclosure provides a display substrate, and the display substrate includes a base substrate, and an insulating layer and a conductive layer that are located on the base substrate and stacked with each other; the conductive layer is on a side of the insulating layer away from the base substrate; the insulating layer includes at least one concave portion extending along a first direction; the conductive layer includes a plurality of signal lines, the plurality of signal lines include a first signal line and a second signal line which are adjacent to each other and arranged side by side, and the first signal line and the second signal line are spaced apart and insulated from each other; the first signal line includes a first overlapping portion which at least partially overlaps with the concave portion in a direction perpendicular to the base substrate; and a distance between the first overlapping portion and the second signal line is greater than or equal to a preset distance, and the preset distance is greater than or equal to ½ of a line width of the first overlapping portion.

In the display substrate provided by the above embodiments of the present disclosure, the first overlapping portion of the first signal line overlaps with the concave portion in the insulating layer in the direction perpendicular to the base substrate, and the distance between the first overlapping portion and the adjacent second signal line is greater than or equal to ½ of the line width of the first overlapping portion, which can reduce or avoid the phenomenon of metal or other conductive substance residues that may occur during the formation of the first overlapping portion due to such as uneven etching or incomplete etching. Furthermore, the risk of short circuit between the first signal line and the second signal line can be reduced or avoided, the stability and reliability of signal transmission on the first signal line and the second signal line can be improved, and the signal transmission effect can be improved, thereby facilitating the optimization of the overall performance of the display substrate.

In the following, embodiments of the present disclosure will be described in detail with reference to the accompanying drawings. It should be noted that the same reference numerals in different drawings will be used to refer to the same described components.

Figure 2:
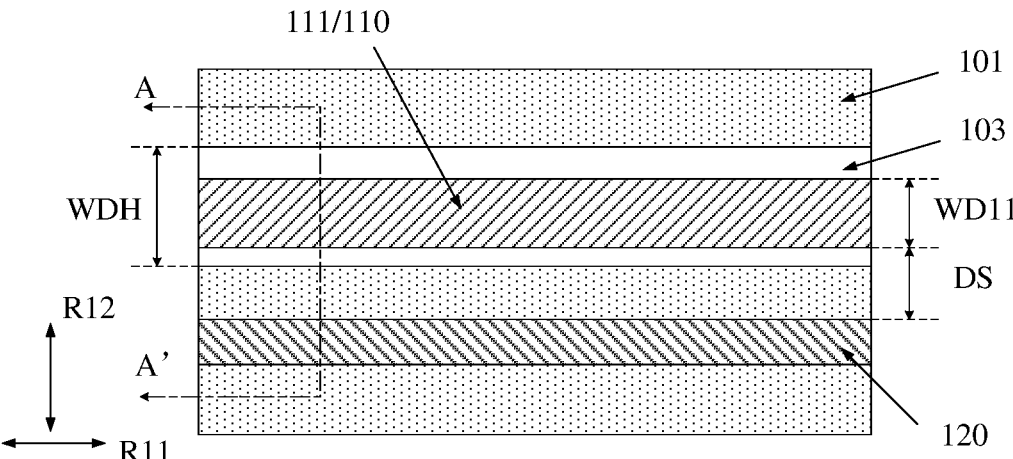
FIG. 2 is a planar structural diagram of a display substrate provided by some embodiments of the present disclosure.
Figure 3:
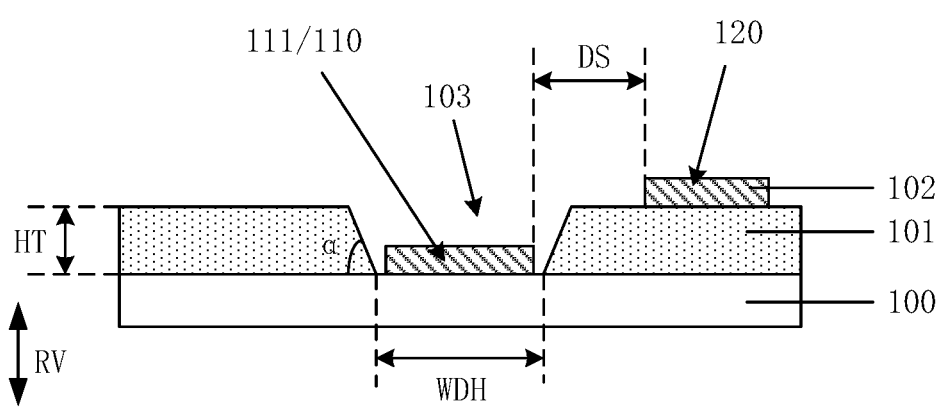
FIG. 3 is a cross-sectional structural diagram of a display substrate provided by some embodiments of the present disclosure.

FIG. 1 is a schematic planar diagram of a display substrate provided by some embodiments of the present disclosure. FIG. 2 is a planar structural diagram of a display substrate provided by some embodiments of the present disclosure, for example, FIG. 2 is a schematic diagram of an example of a partial planar structure in a region RG1 illustrated in FIG. 1. FIG. 3 is a cross-sectional structural diagram of a display substrate provided by some embodiments of the present disclosure, for example, FIG. 3 is a partial cross-sectional structural diagram taken along a line A-A' illustrated in FIG. 2.

For example, as illustrated in FIG. 1 to FIG. 3, the display substrate 10 includes a base substrate 100, and an insulating layer 101 and a conductive layer 102 that are located on the base substrate 100 and stacked with each other. The conductive layer 102 is located on a side of the insulating layer 101 away from the base substrate 100. The insulating layer 101 includes a concave portion 103 extending along the first direction R11. The conductive layer 102 includes a plurality of signal lines, and the plurality of signal lines include a first signal line 110 and a second signal line 120 which are adjacent to each other and arranged side by side.

For example, as illustrated in FIG. 2, the first signal line 110 and the second signal line 120 may be arranged side by side with each other in a second direction R12 different from the first direction R11. For example, the included angle between the first direction R11 and the second direction R12 may be set between 70° and 90°, including 70° and 90°. For example, the included angle between the first direction R11 and the second direction R12 may be set to 70°, 75°, 80°, 85°, 90°, or the like, and the specific value of the included angle may be set according to the actual situation, which is not specifically limited by the embodiments of the present disclosure.

The first signal line 110 and the second signal line 120 are spaced apart and insulated from each other. For example, the first signal line 110 and the second signal line 120 are spaced a certain distance from each other in the second direction R12, that is, there is a distance between the first signal line 110 and the second signal line 120 in the second direction R12, thereby facilitating the insulation between the first signal line 110 and the second signal line 120.

The first signal line 110 includes a first overlapping portion 111, and the first overlapping portion 111 overlaps with the concave portion 103 in a direction RV perpendicular to the base substrate 100. The distance DS between the first overlapping portion 111 and the second signal line 120 is greater than or equal to a preset distance, and the preset distance is greater than or equal to ½ of a line width WD11 of the first overlapping portion 111.

It should be noted that the distance DS between the first overlapping portion 111 and the second signal line 120 may be the minimum distance between the first overlapping portion 111 and the second signal line 120. For example, in the embodiment shown in FIG. 2, in the case that the first overlapping portion 111 and the second signal line 120 are parallel to each other, the distance DS may be the distance between the first overlapping portion 111 and the second signal line 120 in a direction (for example, the second direction R12) perpendicular to the extending direction (for example, the first direction R11) of the first overlapping portion 111 and the second signal line 120.

It should be noted that the line width WD11 of the first overlapping portion 111 may be the width of the first overlapping portion 111 in a direction (for example, the second direction R12) perpendicular to the extending direction (for example, the first direction R11) of the first overlapping portion 111. In the embodiment shown in FIG. 2, the line width of each portion of the first overlapping portion 111 is substantially the same, that is, the line width is WD11 illustrated in FIG. 2. In other embodiments of the present disclosure, the line width of each portion of the first overlapping portion 111 may also be different from each other. For example, the above line width WD11 may be the average line width of each portion of the first overlapping portion 111, or may also be the maximum line width of each portion of the first overlapping portion 111.

In the display substrate 10 provided by the above embodiments of the present disclosure, the first overlapping portion 111 in the first signal line 110 overlaps with the concave portion 103 in the insulating layer 101 in the direction RV perpendicular to the base substrate 100. By making the distance DS between the first overlapping portion 111 and the adjacent second signal line 120 greater than or equal to ½ of the line width WD11 of the first overlapping portion 111, the phenomenon of metal or other conductive substance residues that may occur during the formation of the first overlapping portion 111 due to such as uneven etching or incomplete etching can be reduced or avoided. Thus, the risk of short circuit between the first signal line 110 and the second signal line 120 can be reduced or avoided, the stability and reliability of signal transmission on the first signal line 110 and the second signal line 120 can be improved, and the signal transmission effect can be improved, thereby facilitating the optimization of the overall performance of the display substrate 10.

For example, in the embodiments shown in the above FIG. 1 to FIG. 3, the display substrate 10 includes a functional region 11 and a peripheral region 12 at least partially surrounding the functional region 11. For example, the functional region 11 may be a display region of the display substrate 10. The first signal line 110 and the second signal line 120 may be in the peripheral region 12, for example, in the region RG1 illustrated in FIG. 1, or may also be in other regions of the display substrate 10, for example, in the region RG2 or the region RG3 illustrated in FIG. 1. The embodiments of the present disclosure are not specifically limited in this aspect.

For example, the first signal line 110 and the second signal line 120 may be arranged to partially or completely surround the functional region 11, and the first signal line 110 and the second signal line 120 may be configured to transmit different electrical signals for the functional region 11, respectively. For example, the type of the signal transmitted on the first signal line 110 and the type of the signal transmitted on the second signal line 120 may be the same as or different from each other. For example, the first signal line 110 and the second signal line 120 may be configured to respectively transmit the same type of electrical signals for realizing, for example, the same function or operation, or the first signal line 110 and the second signal line 120 may also be configured to respectively transmit different types of electrical signals for realizing, for example, different functions or different operations. The embodiments of the present disclosure do not limit the specific types of electrical signals transmitted on the first signal line 110 and the second signal line 120.

For example, taking the functional region 11 as a display region of the display substrate 10 as an example, the first signal line 110 and the second signal line 120 may be configured to respectively transmit display data signals for different display rows or different display columns in the display region; alternatively, the first signal line 110 may be configured to transmit a display data signal used for the display region, and the second signal line 120 may be configured to transmit other types of electrical signals, such as a constant voltage or current signal or a ground signal, or the like.

For example, the functional region 11 may also be configured to be a touch region. For example, the functional region 11 may take into account both the display function and the touch function. The first signal line 110 and the second signal line 120 may be configured to respectively transmit a touch driving signal or a touch sensing signal for the touch region. For example, the first signal line 110 and the second signal line 120 may be respectively connected with the corresponding touch driving electrode to provide the required touch driving signal, or may be respectively connected with the corresponding touch sensing electrode to provide the required touch sensing signal, or the first signal line 110 is connected with the corresponding touch driving electrode, and the second signal line 120 is connected with the corresponding touch sensing electrode. The embodiments of the present disclosure are not specifically limited in this aspect.

For example, taking the first signal line 110 connected to the corresponding touch driving electrode and the second signal line 120 connected to the corresponding touch sensing electrode as an example, each touch driving electrode and each touch sensing electrode may be respectively electrically connected with one first signal line 110 and one second signal line 120, so as to be further connected to a touch controller or a touch integrated circuit through the first signal line 110 and the second signal line 120. The touch integrated circuit may be, for example, a touch chip, which is used to provide a touch driving signal to the touch driving electrode, receive a touch sensing signal from the touch sensing electrode, and process the received touch sensing signal, for example, provide the processed data/signal to a system controller to realize the touch sensing function.

For example, ends of the first signal line 110 and the second signal line 120 connected with the touch integrated circuit may be arranged on the same side of the functional region 11 of the display substrate 10 to facilitate the connection with the touch integrated circuit; alternatively, each of the two ends of the touch driving electrode may be provided with one first signal line 110, and during operation, the touch integrated circuit simultaneously inputs the touch driving signal to the touch driving electrode through two first signal lines 110 (e.g., bilateral driving), so that the speed of signal loading on the touch driving electrode can be improved, and thus the detection speed can be improved.

It should be noted that, the functional region 11 may also be configured to be a region with other functions different from the touch function, which is not specifically limited by the embodiments of the present disclosure.

For example, taking the embodiment shown in FIG. 2 as an example, the first signal line 110 is located on a side of the second signal line 120 away from the functional region 11. For example, the first signal line 110 is arranged closer to the outer edge of the display substrate 10 than the second signal line 120, and in the peripheral region 12, the first signal line 110 may be arranged to partially or completely surround the second signal line 120.

It should be noted that, the present disclosure does not specifically limit the setting position between the first signal line 110 and the second signal line 120 relative to the functional region 11. For example, in some other embodiments, according to the actual wiring layout requirements in the display substrate 10, the first signal line 110 may also be located on a side of the second signal line 120 close to the functional region 11.

For example, in the embodiment shown in FIG. 1, the functional region 11 includes an opening 13, the opening 13 is a non-closed opening formed on one side of the functional region 11 (for example, a notch formed on one side of the functional region 11). Alternatively, in some other embodiments of the present disclosure, the opening in the functional region 11 may also be a closed opening formed on one side of the functional region 11. Alternatively, in some other embodiments, the above closed opening or non-closed opening may also be formed on multiple sides of the functional region 11, which is not specifically limited by the embodiments of the present disclosure. In the region where the opening 13 is located, devices such as a camera, a distance sensor or the like may be arranged to facilitate the narrow frame design.

It should be noted that, the embodiments of the present disclosure do not limit the position, number, shape, outline, or the like of the opening 13 in the embodiment shown in FIG. 1. For example, the number of the opening 13 may be one as illustrated in FIG. 1, or may also be two, three or more; and the opening 13 may be in an approximately square shape as illustrated in FIG. 1, or may also be in other suitable regular or irregular shapes such as a circle, a regular hexagon, a regular octagon, etc., which are not specifically limited by the embodiments of the present disclosure.

It should be noted that, the embodiments of the present disclosure take the functional region 11 with a non-closed opening shown in FIG. 1 as an example to explain the structure and function of the display substrate 10, but this does not constitute a limitation of the present disclosure. The embodiments of the present disclosure do not specifically limit whether an opening is provided in the functional region 11 of the display substrate 10, and the setting position, form or the like of the opening in the display substrate 10. The display substrate 10 provided by the embodiments of the present disclosure may be a display substrate whose functional region 11 is designed as an irregular shape as illustrated in FIG. 1, or in some other embodiments of the present disclosure, the display substrate 10 may also be a display substrate whose functional region 11 does not include, for example, a notch or an opening and is designed as a regular shape. The embodiments of the present disclosure do not specifically limit the shape, outline or the like of the display substrate 10.

It should be noted that the embodiments of the present disclosure do not limit the shape, outline, or the like of the display substrate 10. For example, the display substrate provided by the embodiments of the present disclosure may be in a square shape as illustrated in FIG. 1, or other suitable regular or irregular shapes such as a circle, a regular hexagon, a regular octagon, etc., which are not specifically limited by the embodiments of the present disclosure.

In some embodiments of the present disclosure, for example, as illustrated in FIG. 2 and FIG. 3, the above preset distance may be further greater than or equal to 3 times the height HT of the concave portion 103 in the direction RV perpendicular to the base substrate 100, so as to further reduce or avoid the risk of short circuit between the first signal line 110 and the second signal line 120 due to possible residues of metal or other conductive substances when forming the first signal line 110 and the second signal line 120, and improve the stability and reliability of signal transmission on the first signal line 110 and the second signal line 120.

For example, the preset distance may also be further greater than or equal to ½ of the width WDH of the concave portion 103 in the direction (for example, the second direction R12) perpendicular to the first direction R11, so as to further reduce or avoid the risk of short circuit between the first signal line 110 and the second signal line 120 because of possible residues of such as metal or other conductive substances when forming the first signal line 110 and the second signal line 120, and improve the stability and reliability of signal transmission on the first signal line 110 and the second signal line 120.

For example, in a plane parallel to the base substrate 100, the width of the concave portion 103 in the direction (for example, the second direction R12) perpendicular to the first direction R11 may range from 5 μm to 15 μm, further, for example, 8 μm, 10 μm, 12 μm, etc. For example, the height of the concave portion 103 in the direction RV perpendicular to the base substrate 100 may range from 1 μm to 3 μm, further, for example, 1.2 μm, 1.5 μm, 2 μm, 2.5 μm, etc. For example, the drop angle α of the concave portion 103 in the direction RV perpendicular to the base substrate 100 may range from 30° to 50°, further, for example, 35°, 40°, 45°, etc. For example, the line width of the first overlapping portion 111 ranges from 5 μm to 15 μm, further, for example, 8 μm, 10 μm, 12 μm, etc.

For example, the distance DS between the first overlapping portion 111 and the second signal line 120 may range from 3 μm to 14 μm, further, for example, 5 μm, 5.4 μm, 5.7 μm, 6 μm, 7 μm, 8 μm, 10 μm, 12 μm, etc.

For example, in the embodiments shown in the above FIG. 2 and FIG. 3, the second signal line 120 does not overlap with the concave portion 103 in the direction RV perpendicular to the base substrate 100. For example, there is no overlapping portion between the orthographic projection of the second signal line 120 on the base substrate 100 and the orthographic projection of the concave portion 103 on the base substrate 100. Thus, by adjusting the relative position between the second signal line 120 and the concave portion 103 in the plane parallel to the base substrate 100, the risk of short circuit between the first signal line 110 and the second signal line 120 caused by the residues of conductive substances such as metal that may occur when the first signal line 110 is formed can be better reduced or avoided, and therefore adverse effects on signal transmission on the first signal line 110 and the second signal line 120 can be reduced or avoided, thereby improving the stability and reliability of the signal transmission on the first signal line 110 and the second signal line 120.

For example, in some embodiments of the present disclosure, as illustrated in FIG. 2 and FIG. 3, the first overlapping portion 111 completely overlaps with the concave portion 103 in the direction RV perpendicular to the base substrate 100. For example, the orthographic projection of the first overlapping portion 111 on the base substrate 100 is located within a region surrounded by the orthographic projection of the concave portion 103 on the base substrate 100 in the direction (for example, the second direction R12) perpendicular to the first direction R11. For example, in the above embodiments, the first overlapping portion 111 of the first signal line 110 may be completely formed in the region corresponding to the concave portion 103 in the insulating layer 101, so that the residual phenomenon of conductive substances such as metal that may occur when the first signal line 110 is formed can be reduced or avoided, and thus, the risk of short circuit between the first signal line 110 and the adjacent, for example, second signal line 120 or other conductive structures or lines can be better avoided.

Figure 4:
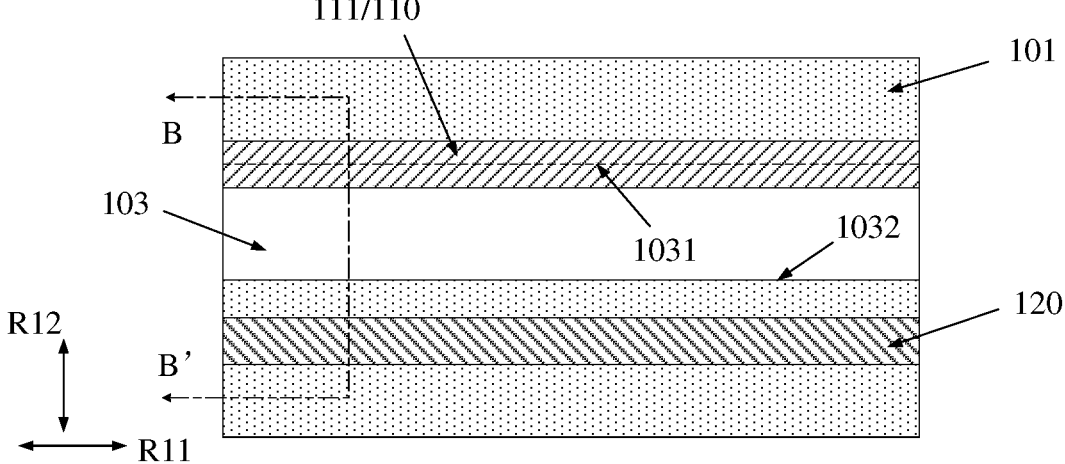
FIG. 4 is a planar structural diagram of another display substrate provided by some embodiments of the present disclosure.
Figure 5:
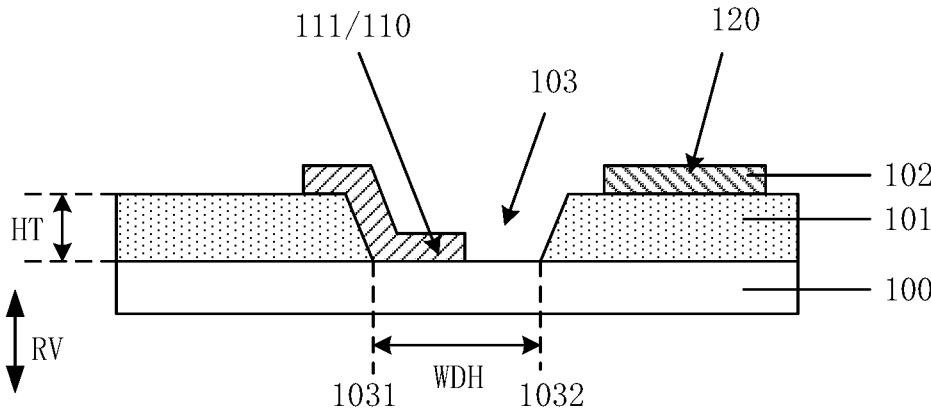
FIG. 5 is a cross-sectional structural diagram of another display substrate provided by some embodiments of the present disclosure.

For another example, in some embodiments of the present disclosure, FIG. 4 is a planar structural diagram of another display substrate provided by some embodiments of the present disclosure, for example, is a schematic diagram of another example of a partial planar structure in the region RG1 (or the region RG2 or the region RG3) illustrated in FIG. 1. FIG. 5 is a cross-sectional structural diagram of a display substrate provided by some embodiments of the present disclosure, for example, FIG. 5 is a partial cross-sectional structural diagram taken along a line B-B' illustrated in FIG. 4.

As illustrated in FIG. 4 and FIG. 5, the first overlapping portion 111 may also partially overlaps with the concave portion 103 in the direction RV perpendicular to the base substrate 100. That is, in the direction RV perpendicular to the base substrate 100, the first signal line 110 partially overlaps with the concave portion 103, and the portion of the first signal line 110 that overlaps with the concave portion 103 is the first overlapping portion 111. For example, the portion of the first signal line 110 that does not overlap with the concave portion 103 is arranged on the insulating layer 101, and its surface on a side close to the base substrate 100 is in direct contact with the insulating layer 101. The surface of the first overlapping portion 111 on a side close to the base substrate 100 is not in contact with the insulating layer 101.

It should be noted that, in the embodiments shown in FIG. 4 and FIG. 5, in order to clearly illustrate the overlapping relationship between the first signal line 110 and the concave portion 103 in the direction RV perpendicular to the base substrate 100, no other structure or film layer is provided between the insulating layer 101 and the base substrate 100. That is, the insulating layer 101 is in direct contact with the base substrate 100, and the first overlapping portion 111 is in direct contact with the base substrate 100. In some other embodiments of the present disclosure, other structure(s) or film layer(s) may also be provided between the insulating layer 101 and the base substrate 100, and the embodiments of the present disclosure are not specifically limited in this aspect. For example, in this case, the first overlapping portion 111 may be provided on the other structure(s) or film layer(s).

For example, the concave portion 103 includes a first edge 1031 and a second edge 1032 which are opposite to each other and respectively extend in the first direction R11. In the direction RV perpendicular to the base substrate 100, the first signal line 110 overlaps with the first edge 1031 of the concave portion 103 and does not overlap with the second edge 1032 of the concave portion 103. That is, the ortho-graphic projection of the first overlapping portion 111 on the base substrate 100 partially overlaps with the orthographic projection of the concave portion 103 on the base substrate 100. For example, in the second direction R12, the ortho-graphic projection of the first overlapping portion 111 on the base substrate 100 overlaps with the orthographic projection of the first edge 1031 of the concave portion 103 on the base substrate 100, and does not overlap with the orthographic projection of the second edge 1032 of the concave portion 103 on the base substrate 100.

The orthographic projection of the second signal line 120 on the base substrate 100 is located on a side of the orthographic projection of the second edge 1032 on the base substrate 100 away from the orthographic projection of the first edge 1031 on the base substrate 100. That is, in a plane parallel to the base substrate 100, the second signal line 120 is located on a side of the second edge 1032 away from the first edge 1031. For example, as illustrated in FIG. 4, the first edge 1031 is located above the second edge 1032, and the second signal line 120 is located below the second edge 1032. Thus, the risk of short circuit between the second signal line 120 and the residues of conductive substances such as metal that may occur when the first signal line 110 is formed can be reduced or avoided.

It should be noted that, except for the overlapping position between the first signal line 110 and the concave portion 130, other structures in the embodiments shown in FIG. 4 and FIG. 5 are substantially the same as or similar to the structures in the embodiments shown in FIG. 2 and FIG. 3. Details may refer to the corresponding description in the embodiments shown in FIG. 2 and FIG. 3, and will not be repeated here.

For example, in the embodiment shown in FIG. 2, the average line width of the first signal line 110 may be different from the average line width of the second signal line 120, thereby facilitating the first signal line 110 and the second signal line 120 for respectively transmitting electri-cal signals for realizing different functions. For example, as illustrated in FIG. 2, the average line width of the first signal line 110 may be larger than the average line width of the second signal line 120, thereby improving the stability and reliability of signal transmission on the first signal line 110 and improving the signal transmission effect.

For example, in some examples, the first signal line 110 may be located on a side of the second signal line 120 away from the functional region 11, that is, the first signal line 110 may be arranged closer to the edge of the display substrate 10 than the second signal line 120. For example, the first signal line 110 may be used to transmit a ground signal, and the second signal line 120 may be configured to transmit a signal of other different types used for the functional region 11, thus facilitating the optimization of wiring layout design in the peripheral region 12.

For example, in the embodiment shown in FIG. 4, the average line width of the first signal line 110 may be substantially equal to the average line width of the second signal line 120. For example, in the case that the functional region 11 is configured as the touch region, the first signal line 110 and the second signal line 120 may be configured to respectively transmit, for example, a touch driving signal or a touch sensing signal for the touch region. It should be noted that the embodiments of the present disclosure do not limit the specific types of signals transmitted on the first signal line 110 and the second signal line 120.

Figure 6:
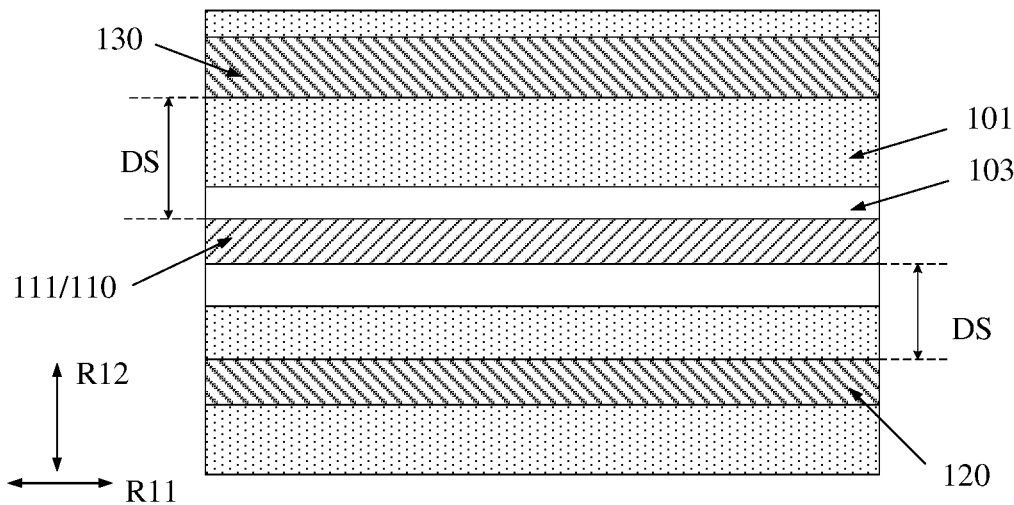
FIG. 6 is a planar structural diagram of further still another display substrate provided by some embodiments of the present disclosure.

FIG. 6 is a planar structural diagram of further still another display substrate provided by some embodiments of the present disclosure, for example, FIG. 6 is a schematic diagram of another example of a partial planar structure in the region RG1 (or the region RG2 or the region RG3) illustrated in FIG. 1. It should be noted that, except for the third signal line 130, other structures in the embodiment shown in FIG. 6 are substantially the same as or similar to the structures in the embodiment shown in FIG. 2. Details may refer to the corresponding description in the embodiment shown in FIG. 2, and will not be repeated here.

For example, as illustrated in FIG. 6, the plurality of signal lines in the display substrate 10 further include a third signal line 130. The third signal line 130 and the first signal line 110 are adjacent to each other and arranged side by side. The third signal line 130 is located on a side of the first signal line 110 away from the second signal line 120, that is, the first signal line 110 is located between the third signal line 130 and the second signal line 120. For example, in the second direction R12, the third signal line 130, the first signal line 110, and the second signal line 120 are arranged in sequence.

For example, in the embodiment shown in FIG. 6, the third signal line 130 may be located on a side of the first signal line 110 and the second signal line 120 away from the functional region 11, and the distance DS between the first overlapping portion 111 and the third signal line 130 may be set to be greater than the distance DS between the first overlapping portion 111 and the second signal line 120, thereby facilitating the optimization of the wiring layout design in the peripheral region 12.

For example, in the embodiment shown in FIG. 6, the third signal line 130 may be used to transmit, for example, a ground signal, and the first signal line 110 and the second signal line 120 may be configured to transmit other signals of different types used for the functional region 11, such as a display data signal, a touch sensing signal, a touch driving signal, or the like. It should be noted that, the embodiments of the present disclosure do not specifically limit the types of signals transmitted on the first signal line 110, the second signal line 120, and the third signal line 130.

For example, in the above embodiments shown in FIG. 2, FIG. 4 and FIG. 6, the first overlapping portion 111 extends along the first direction R11, and further, for example, the first signal line 110 and the second signal line 120 both extend along the first direction R11. In other embodiments of the present disclosure, the extending directions of the first overlapping portion 111, the first signal line 110, and the second signal line 120 may be determined according to different actual needs. For example, the extending directions may also be set to other suitable extending directions according to the actual wiring layout in the display substrate 10. The embodiments of the present disclosure are not limited in this aspect.

Figure 7:
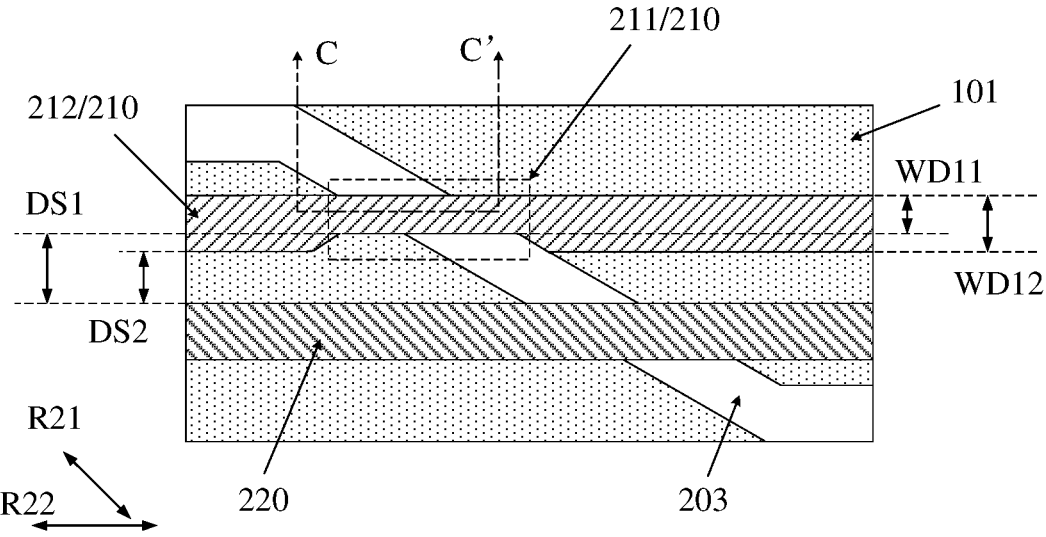
FIG. 7 is a planar structural diagram of further still another display substrate provided by some embodiments of the present disclosure.
Figure 9:
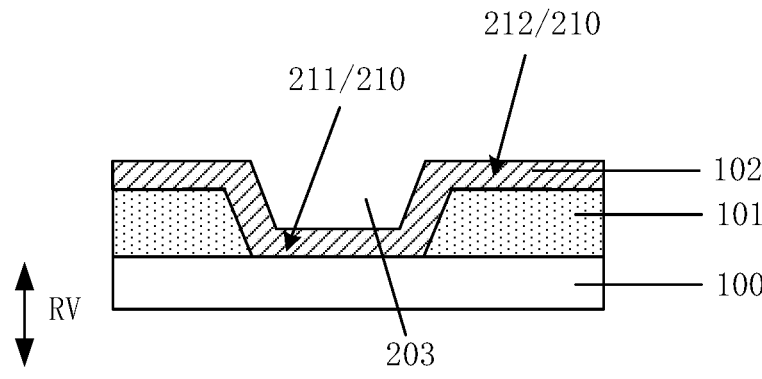
FIG. 9 is a cross-sectional structural diagram of further still another display substrate provided by some embodiments of the present disclosure.

FIG. 7 is a planar structural diagram of further still another display substrate provided by some embodiments of the present disclosure, for example, FIG. 7 is a schematic diagram of another example of a partial planar structure in the region RG1 (or the region RG2 or the region RG3) illustrated in FIG. 1. FIG. 9 is a cross-sectional structural diagram of further still another display substrate provided by some embodiments of the present disclosure, for example, FIG. 9 is a partial cross-sectional structural diagram taken along a line C-C' illustrated in FIG. 7.

For example, in the embodiments shown in FIG. 7 and FIG. 9, the first overlapping portion 212, the first signal line 210, and the second signal line 220 respectively extend in the second direction R22 different from the first direction R21. For example, the included angle between the first direction R21 and the second direction R22 may be set between 70° and 90°, including 70° and 90°. For example, the included angle between the first direction R21 and the second direction R22 may be set to 70°, 75°, 80°, 85°, 90°, or the like, and the specific value of the included angle may be set according to the actual situation, which is not specifically limited by the embodiments of the present disclosure.

For example, as illustrated in FIG. 7 and FIG. 9, the first signal line 210 includes a first overlapping portion 211 that overlaps with the concave portion 203 in the direction RV perpendicular to the base substrate 100, and further includes a first main portion 212 that does not overlap with the concave portion 203 in the direction RV perpendicular to the base substrate 100.

For example, as illustrated in FIG. 7, the extending direction of the first overlapping portion 211 and the extending direction of the first main portion 212 may be substantially the same, for example, both extend roughly along the second direction R22. Alternatively, in some other embodiments of the present disclosure, the extending direction of the first overlapping portion 211 and the extending direction of the first main portion 212 may also be different from each other, and the embodiments of the present disclosure are not specifically limited in this aspect.

For example, the distance DS1 between the first overlapping portion 211 and the second signal line 220 is greater than or equal to the distance DS2 between the first main portion 212 and the second signal line 220. Thus, by relatively increasing the distance DS1 between the first overlapping portion 211 and the second signal line 220, the risk of short circuit between the first signal line 210 and the second signal line 220 caused by the residues of conductive substances such as metal that may occur when the first overlapping portion 211 is formed can be reduced or avoided, thereby reducing or avoiding adverse effects on the signal transmission on the first signal line 210 and the second signal line 220.

For example, in the embodiment shown in FIG. 7, the line width WD12 of the first main portion 212 is greater than the line width WD11 of the first overlapping portion 211, so that the distance DS1 between the first overlapping portion 211 and the second signal line 220 is greater than the distance DS2 between the first main portion 212 and the second signal line 220.

Figure 8:
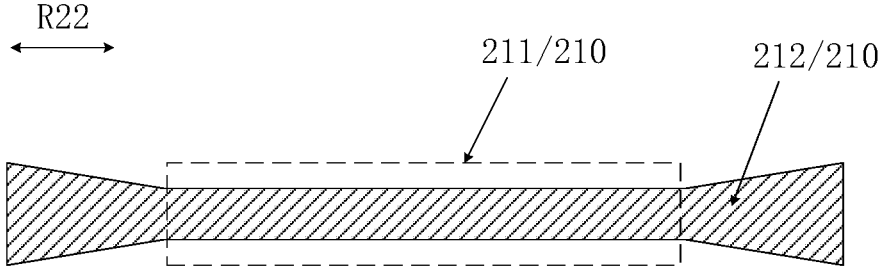
FIG. 8 is a schematic planar diagram of a first signal line of a display substrate provided by some embodiments of the present disclosure.

FIG. 8 is a schematic planar diagram of a first signal line of a display substrate provided by some embodiments of the present disclosure. For example, in addition to the shape outline of the first signal line 210 illustrated in FIG. 7, the first signal line 210 illustrated in FIG. 7 may also adopt the shape outline illustrated in FIG. 8.

For example, as illustrated in FIG. 8, in the first signal line 210, the line width of the first main portion 212 may gradually decrease in a direction close to the first overlapping portion 211. Thus, the line width of the end connected with the first overlapping portion 211 in the first main portion 212 may be equal to or approximately equal to the line width of the first overlapping portion 211, which is conducive to simplifying the manufacturing process of the first signal line 210 and reducing the manufacturing cost.

It should be noted that, the embodiments of the present disclosure do not limit the specific method of realizing the gradual decreasing of the line width of the first main portion 212 in the direction close to the first overlapping portion 211. For example, it may be achieved by changing the extending direction of one edge of the first main portion 212, or may also be achieved by changing the extending directions of two opposite edges in the first main portion 212 at the same time.

It should be noted that other structures or functions in the embodiments shown in FIG. 7 and FIG. 9 may refer to the corresponding description in the embodiments shown in FIG. 2 or FIG. 4, and will not be repeated here. For example, for the stacking relationship between the first signal line 210 and the concave portion 203 in the direction RV perpendicular to the base substrate 100 shown in FIG. 9, reference may be made to the description of the stacking relationship between the first signal line 110 and the concave portion 103 in the direction RV perpendicular to the base substrate 100 shown in FIG. 3 or FIG. 5, which will not be repeated here.

For example, in the embodiment shown in FIG. 7, the second signal line 220 also overlaps with the concave portion 203 in the direction RV perpendicular to the base substrate 100. Thus, by relatively increasing the distance DS1 between the first overlapping portion 211 and the second signal line 220, the risk of short circuit between the first signal line 210 and the second signal line 220 caused by the residues of conductive substances such as metal that may occur when the second signal line 220 is formed can also be reduced or avoided.

For another example, in some embodiments of the present disclosure, the line width of each portion of the second signal line 220 may also be adjusted. For example, the line width of the portion of the second signal line 220 corresponding to the first overlapping portion 211 may be made smaller than the line width of the portion of the second signal line 220 corresponding to the first main portion 212. Alternatively, the line width of the portion of the second signal line 220 that overlaps with the concave portion 203 in the direction RV perpendicular to the base substrate 100 may be made smaller than the line width of the portion of the second signal line 220 that does not overlap with the concave portion 203 in the direction RV perpendicular to the base substrate 100. Thus, the risk of short circuit between the first signal line 210 and the second signal line 220 caused by the residues of conductive substances such as metal that may occur when the first signal line 210 and the second signal line 220 are formed can be better reduced or avoided.

Figure 10:
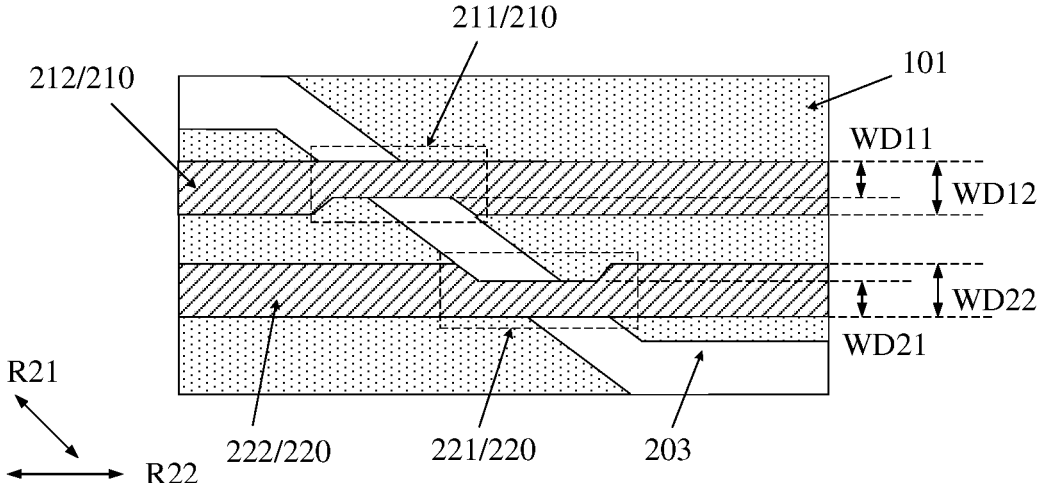
FIG. 10 is a planar structural diagram of further still another display substrate provided by some embodiments of the present disclosure.

FIG. 10 is a planar structural diagram of further still another display substrate provided by some embodiments of the present disclosure, for example, FIG. 10 is a schematic diagram of further still another example of a partial planar structure in the region RG1 (or the region RG2 or the region RG3) illustrated in FIG. 1. It should be noted that, except for the setting mode of the second overlapping portion 221 and the second main portion 222 of the second signal line 220, other structures in the embodiment shown in FIG. 10 are substantially the same as or similar to the structures in the embodiments shown in FIG. 7 and FIG. 9. Details may refer to the corresponding description in the embodiments shown in FIG. 7 and FIG. 9, and will not be repeated here.

For example, as illustrated in FIG. 10, the second signal line 220 includes a second overlapping portion 221 and a second main portion 222. The second overlapping portion 221 overlaps with the concave portion 203 in the direction RV perpendicular to the base substrate 100, and the second main portion 222 does not overlap with the concave portion 203 in the direction RV perpendicular to the base substrate 100. For example, as illustrated in FIG. 10, the extending direction of the second overlapping portion 221 and the extending direction of the second main portion 222 may be substantially the same, for example, both extend roughly along the second direction R22. Alternatively, in some other embodiments of the present disclosure, the extending direction of the second overlapping portion 221 and the extending direction of the second main portion 222 may also be different from each other. The embodiments of the present disclosure are not specifically limited in this aspect.

For example, the distance between the second overlapping portion 221 and the first signal line 210 is greater than or equal to the distance between the second main portion 222 and the first signal line 210. Thus, the risk of short circuit between the first signal line 210 and the second signal line 220 caused by the residues of conductive substances such as metal that may occur when the first signal line 210 and the second signal line 220 are formed can be better reduced or avoided, so as to improve the stability and reliability of signal transmission on the first signal line 210 and the second signal line 220.

For example, the line width WD22 of the second main portion 222 is greater than the line width WD21 of the second overlapping portion 221, so that the distance between the second overlapping portion 221 and the first signal line 210 is greater than the distance between the second main portion 222 and the first signal line 210.

Figure 11:
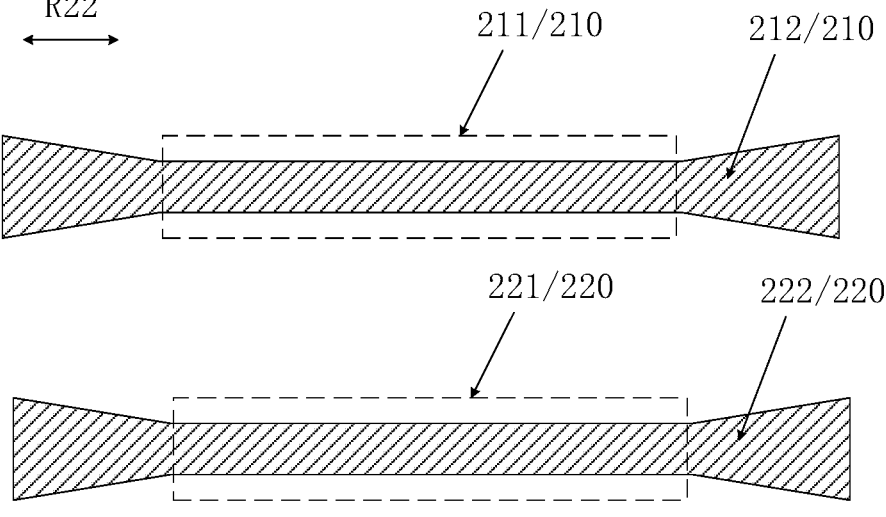
FIG. 11 is a schematic planar diagram of a first signal line and a second signal line of a display substrate provided by some embodiments of the present disclosure.

FIG. 11 is a schematic planar diagram of a first signal line and a second signal line of a display substrate provided by some embodiments of the present disclosure. For example, in addition to the shape outlines of the first signal line 210 and the second signal line 220 shown in FIG. 10, the first signal line 210 and the second signal line 220 shown in FIG. 10 may also adopt the shape outlines shown in FIG. 11.

For example, as illustrated in FIG. 11, in the second signal line 220, the line width of the second main portion 222 may gradually decrease in a direction close to the second overlapping portion 221. Thus, the line width of the end connected with the second overlapping portion 221 in the second main portion 222 can be made equal to or approximately equal to the line width of the second overlapping portion 221, which is conducive to simplifying the manufacturing process of the second signal line 220 and reducing the manufacturing cost.

It should be noted that, the embodiments of the present disclosure do not limit the specific method of realizing the gradual decreasing of the line width of the second main portion 222 in the direction close to the second overlapping portion 221. For example, it may be achieved by changing the extending direction of one edge of the second main portion 222, or may also be achieved by changing the extending directions of two opposite edges in the second main portion 222 at the same time.

Figure 12:
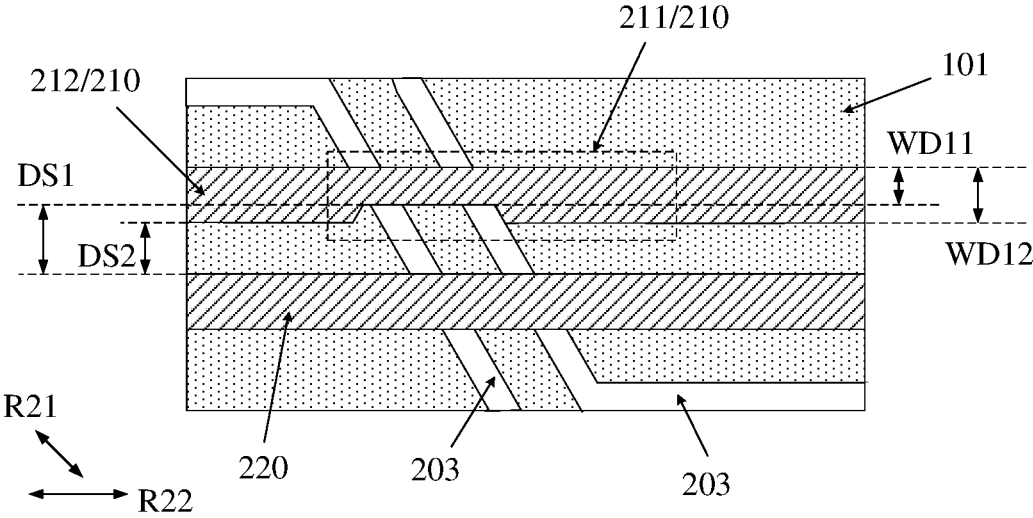
FIG. 12 is a planar structural diagram of further still another display substrate provided by some embodiments of the present disclosure.

FIG. 12 is a planar structural diagram of further still another display substrate provided by some embodiments of the present disclosure, for example, FIG. 12 may be a schematic diagram of another example of a partial planar structure in the region RG1 illustrated in FIG. 1 (or the region RG2 or the region RG3 illustrated in FIG. 1). It should be noted that, except for the number of concave portions 203, other structures in the embodiment shown in FIG. 12 are substantially the same as or similar to the structures in the embodiments shown in FIG. 7 and FIG. 9. Details may refer to the corresponding description in the embodiments shown in FIG. 7 and FIG. 9, and will not be repeated here.

For example, as illustrated in FIG. 12, the insulating layer of the display substrate 10 may include a plurality of concave portions 203. The first signal line 210 overlaps with the plurality of concave portions 203 in the direction RV perpendicular to the base substrate 100. For example, by relatively increasing the distance DS1 between the first overlapping portion 211 overlapping with each concave portion 203 and the second signal line 220, the risk of short circuit between the first signal line 210 and the second signal line 220 caused by the residues of conductive substances such as metal that may occur when the first overlapping portion 211 is formed can be reduced or avoided.

It should be noted that the embodiments of the present disclosure do not limit the specific number of concave portions 203 included in the insulating layer of the display substrate 10. For example, in other embodiments of the present disclosure, the number of concave portions 230 in the insulating layer of the display substrate 10 may also be three, four, five or more, and the embodiments of the present disclosure are not specifically limited in this aspect.

It should be noted that, in other embodiments of the present disclosure, the plurality of signal lines in the display substrate 10 may further include other signal lines, such as a fourth signal line, a fifth signal line, or the like arranged side by side with the first signal line and the second signal line. That is, the number of the plurality of signal lines in the display substrate 10 may also be three, four, five or more, and the embodiments of the present disclosure are not limited in this aspect. For example, other signal lines included in the plurality of signal lines may adopt the same design method as the first signal line, the second signal line, and the third signal line in the embodiments of the present disclosure, so as to better achieve the above technical effects of the present disclosure.

In some embodiments of the present disclosure, the material of the conductive layer 102 may include a metal material such as aluminum, molybdenum, copper, silver, etc., or an alloy material of these metal materials, such as silver palladium copper alloy (APC) materials.

For example, the material of the insulating layer 101 may be an inorganic insulating material, for example, the inorganic insulating material is a transparent material. For example, the inorganic insulating material is an oxide of silicon, a nitride of silicon or a nitrogen oxide of silicon, such as silicon oxide, silicon nitride or silicon oxynitride, or an insulating material including a metal nitrogen oxide such as aluminum oxide or titanium nitride. For example, the material of the insulating layer 101 may also be an organic insulating material to obtain good bending resistance. For example, the organic insulating material is a transparent material. For example, the organic insulating material is OCA optical glue. For example, the organic insulating material may include polyimide (PI), acrylate, epoxy resin, polymethylmethacrylate (PMMA), etc.

Figure 13:
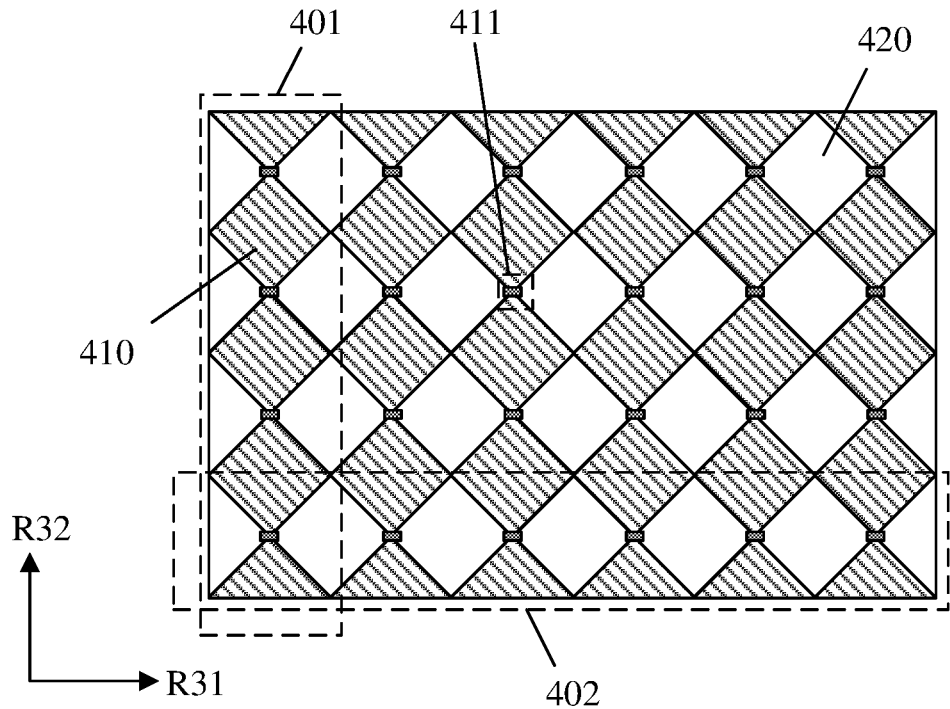
FIG. 13 is a schematic diagram of an example of a partial planar structure in a functional region of a display substrate provided by some embodiments of the present disclosure.

For example, the functional region 11 is configured to be a display touch region that takes into account both the display function and the touch function, and the first signal line 110 and the second signal line 120 are configured to respectively transmit a touch driving signal or a touch sensing signal for the display touch region. FIG. 13 is a schematic diagram of an example of a partial planar structure in a functional region of a display substrate provided by some embodiments of the present disclosure. For example, FIG. 13 may be a schematic diagram of an example of a partial planar structure in the functional region 11 of the display substrate 10 illustrated in FIG. 1.

For example, in the example illustrated in FIG. 13, the display substrate 10 further includes a plurality of first touch electrodes 401 and a plurality of second touch electrodes 402 on the base substrate 100. The plurality of first touch electrodes 401 are arranged in the direction R31, and each first touch electrode 401 extends in the direction R32 different from the direction R31. The plurality of second touch electrodes 402 are arranged in the direction R32, and each second touch electrode 402 extends in the direction R31.

For example, the included angle between the direction R31 and the direction R32 may be set between 70° and 90°, including 70° and 90°. For example, the included angle between the direction R31 and the direction R32 may be set to 70°, 75°, 80°, 85°, 90°, or the like, and the specific value of the included angle may be set according to the actual situation, which is not specifically limited by the embodiments of the present disclosure.

For example, in the display substrate 10 provided by the embodiments of the present disclosure, the direction R31 may be perpendicular to the direction R32. For example, in the case that the display substrate 10 provided by the embodiments of the present disclosure is applied to, for example, a display panel or a display device, the direction R31 may be the row direction of the sub-pixel array in the display panel or the display device, and the direction R32 may be the column direction of the sub-pixel array in the display panel or the display device; alternatively, the direction R31 may be the column direction of the sub-pixel array in the display panel or the display device, and the direction R32 may be the row direction of the sub-pixel array in the display panel or the display device, which is not specifically limited by the embodiments of the present disclosure.

For example, as illustrated in FIG. 13, each first touch electrode 401 includes a plurality of first touch sub-electrodes 410 and a plurality of first connection electrodes 411. The plurality of first touch sub-electrodes 410 are arranged in the direction R32, and the first connection electrode 411 is located between two adjacent first touch sub-electrodes 410 in the direction R32, so that the two adjacent first touch sub-electrodes 410 are electrically connected to each other through the first connection electrode 411. For example, each second touch electrode 402 includes a plurality of second touch sub-electrodes 420 and a plurality of second connection electrodes (not shown in the figure). The plurality of second touch sub-electrodes 420 are arranged in the direction R31, and the second connection electrode is located between two adjacent second touch sub-electrodes 420 in the direction R31, so that the two adjacent second touch sub-electrodes 420 are electrically connected to each other through the second connection electrode.

It should be noted that the number of the first touch sub-electrodes 410 and the first connection electrodes 411 included in the first touch electrode 401 and the number of the second touch sub-electrodes 420 included in the second touch electrode 402 shown in FIG. 13 are only illustrative, and the embodiments of the present disclosure are not specifically limited in this aspect. It should be noted that the main body outline of the first touch sub-electrode 410 in the first touch electrode 401 and the main body outline of the second touch sub-electrode 420 in the second touch electrode 402 illustrated in FIG. 13 are diamond; and in other embodiments or examples of the present disclosure, the first touch sub-electrode 410 and the second touch sub-electrode 420 may also adopt other regular or irregular shapes such as a triangle, a rectangle, a hexagon, an octagon, a strip, etc., which are not specifically limited by the embodiments of the present disclosure. For example, the main body outlines of the first touch sub-electrode 410 and the second touch sub-electrode 420 may be the same as each other or different from each other.

For example, the first touch sub-electrode 410 and the first connection electrode 411 are respectively located in different conductive layers relative to the base substrate 100, and the first touch sub-electrode 410 and the first connection electrode 411 are electrically connected through a via hole structure at least penetrating the insulating layer. For example, the second touch sub-electrode 420 and the second connection electrode may be located in the same conductive layer relative to the base substrate 100, that is, in the same conductive layer as the first touch sub-electrode 410, and for example, insulated from the first touch sub-electrode 410. For example, the second touch sub-electrode 420 and the corresponding connected second connection electrode may be integrally arranged.

For example, each first touch electrode 401 and each second touch electrode 402 may include a grid structure formed by a plurality of metal grids. For example, the metal grid may be a closed metal grid or a non-closed metal grid. The embodiments of the present disclosure do not limit the number and specific pattern features such as the shape, outline, size, or the like of the metal grid formed in the grid structure. For example, the shape of the metal grid may be triangle, quadrilateral, pentagon, hexagon, heptagon, etc., which may be designed according to actual needs. The embodiments of the present disclosure do not specifically limit the specific shape and size of the metal grid. For example, the material of the metal grid in the grid structure of the first touch electrode 401 and the second touch electrode 402 may include a metal material such as aluminum, molybdenum, copper, silver, etc., or an alloy material of these metal materials, such as silver palladium copper alloy (APC) materials.

For example, one metal grid may correspond to one or more sub-pixels, and the orthographic projection of the one or more sub-pixels on the base substrate is located within the region surrounded by the orthographic projection of the corresponding metal grid on the base substrate. For example, the mesh of the metal grid covers the one or more sub-pixels, for example, may cover the pixel opening region of the one or more sub-pixels. For example, the orthographic projection of the metal line of the metal grid on the base substrate is located outside the orthographic projection of the corresponding pixel opening region of the one or more sub-pixels on the base substrate, that is, located in the region surrounded by the orthographic projection of the pixel separation region among the pixel opening regions on the base substrate, and the pixel separation region may be, for example, the non-opening region of the pixel definition layer. The pixel separation region is used to separate the pixel opening regions of the plurality of sub-pixels, so as to separate the light-emitting layer of each sub-pixel to prevent color crossing.

For example, the first touch electrode 401 and the second touch electrode 402 are both located in the functional region 11 to realize the touch function. For example, the first signal line 110 may be correspondingly connected with the touch driving electrode 401 (that is, the first touch electrode 401) shown in FIG. 13 to transmit the required touch driving signal, and the second signal line 120 may be correspondingly connected with the touch sensing electrode 402 (that is, the second touch electrode 402) shown in FIG. 13 to transmit the required touch sensing signal. For example, each touch driving electrode 401 may be electrically connected with one first signal line 110, and each touch sensing electrode 402 may be electrically connected with one second signal line 120, so that each touch driving electrode 401 and each touch sensing electrode 402 may be respectively connected to a touch controller or a touch integrated circuit through the corresponding first signal line 110 and the second signal line 120.

For example, the touch integrated circuit may be a touch chip, which is used to provide a touch driving signal to the touch driving electrode 401, receive a touch sensing signal from the touch sensing electrode 402, and process the received touch sensing signal, such as providing the processed data/signal to the system controller to realize the touch sensing function. For example, one end of the first signal line 110 and one end of the second signal line 120 connected with the touch integrated circuit may be arranged on the same side of the functional region 11 of the display substrate 10 to facilitate the connection with the touch integrated circuit; alternatively, each of the two ends of the touch driving electrode 401 may be provided with one first signal line 110, and during operation, the touch integrated circuit simultaneously inputs the touch driving signal to the touch driving electrode 401 through two first signal lines 110 (e.g., bilateral driving), so that the speed of signal loading on the touch driving electrode 401 can be improved, and thus the detection speed is improved.

Figure 14:
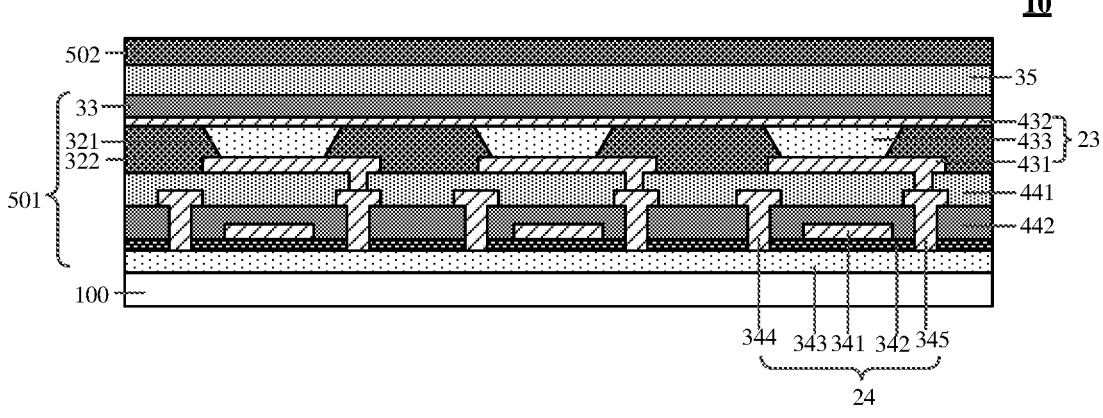
FIG. 14 is a schematic diagram of a specific example of a cross-sectional structure in a functional region of a display substrate provided by some embodiments of the present disclosure.

For example, taking the embodiment provided in FIG. 13 as an example, FIG. 14 is a schematic diagram of a specific example of a cross-sectional structure in a functional region of a display substrate provided by some embodiments of the present disclosure. For example, the display substrate 10 includes a display device 501 and a touch sensing structure 502 composed of, for example, the touch driving electrode 401 and the touch sensing electrode 402 in the embodiment provided in FIG. 13. In the display substrate 10, the display device 501 and the touch sensing structure 502 are stacked.

For example, as illustrated in FIG. 14, the touch sensing structure 502 is located on the display side of the display device 501, such as the side closer to the user during use.

For example, the embodiment takes the display substrate 10 as an OLED display substrate as an example. For example, the OLED display substrate may be an on-cell or in-cell touch display substrate. Of course, in other embodiments, the display substrate 10 may also be a liquid crystal display substrate, and the embodiments of the present disclosure do not limit the specific type of the display substrate.

For example, the display device 501 includes a plurality of sub-pixels arranged in an array. For example, the display substrate 10 is an OLED display substrate, and the plurality of sub-pixels may include green sub-pixels, red sub-pixels, blue sub-pixels, or the like. Each sub-pixel includes a light-emitting element 23 and a pixel driving circuit that drives the light-emitting element 23 to emit light. The embodiments of the present disclosure do not limit the type and specific composition of the pixel driving circuit. For example, the pixel driving circuit may be of a current driving type or a voltage driving type, may be a 2T1C driving circuit (that is, two transistors and one capacitor, the two transistors include a driving transistor and a data writing transistor), and may further include a compensation circuit (a compensation transistor), a light-emitting control circuit (a light-emitting control transistor), a reset circuit (a reset transistor), or the like on the basis of the 2T1C driving circuit.

For clarity, FIG. 14 shows a first transistor 24 in the pixel driving circuit that is directly electrically connected to the light-emitting element 23. The first transistor 24 may be a driving transistor configured to operate in a saturated state and control the magnitude of the current that drives the light-emitting element 23 to emit light. For example, the first transistor 24 may also be a light-emitting control transistor for controlling whether the current driving the light-emitting element 23 to emit light passes through. The embodiments of the present disclosure do not limit the specific type of the first transistor 24.

For example, the light-emitting element 23 is an organic light-emitting diode, including a first electrode 431, a light-emitting layer 433, and a second electrode 432. One of the first electrode 431 and the second electrode 432 is an anode and the other is a cathode. For example, the first electrode 431 is an anode, and the second electrode 432 is a cathode. For example, the light-emitting layer 433 is an organic light-emitting layer or a quantum dot light-emitting layer. For example, in addition to the light-emitting layer 433, the light-emitting element 23 may further include auxiliary function layers such as a hole injection layer, a hole transport layer, an electron injection layer, and an electron transport layer. For example, the light-emitting element 23 may be a top emitting structure, and the first electrode 431 is reflective and the second electrode 432 is transmissive or semi-transmissive. For example, the first electrode 431 adopts a high work function material to act as the anode, such as an ITO/Ag/ITO stacked structure; and the second electrode 432 adopts a low work function material to act as the cathode, such as a semi-transmissive metal or metal alloy material, such as an Ag/Mg alloy material.

The first transistor 24 includes a gate electrode 341, a gate insulating layer 342, an active layer 343, a first electrode 344, and a second electrode 345, and the second electrode 345 is electrically connected with the first electrode 431 of the light-emitting element 23. The embodiments of the present disclosure do not limit the type, material, structure, or the like of the first transistor 24, for example, the first transistor 24 may be of a top gate type, a bottom gate type, etc. For example, the active layer 343 of the first transistor 24 may be amorphous silicon, polycrystalline silicon (low-temperature polycrystalline silicon and high-temperature polycrystalline silicon), oxide semiconductors (for example, indium gallium tin oxide (IGZO)), and the like. For example, the first transistor 24 may be an N-type transistor or a P-type transistor.

The transistors (such as the first transistor 24) used in the embodiments of the present disclosure may be thin-film transistors, field-effect transistors or other switching devices with the same characteristics. The embodiments of the present disclosure are illustrated by taking the thin-film transistors as an example. The source electrode and drain electrode of the transistor used here may be symmetrical in structure, so there may be no difference in the structure between the source electrode and drain electrode. In the embodiments of the present disclosure, in order to distinguish the two electrodes of the transistor except the gate electrode, it is directly described that one electrode is the first electrode and the other electrode is the second electrode.

As illustrated in FIG. 14, the display device 501 further includes a pixel definition layer 322, the pixel definition layer 322 is arranged on the first electrode 431 of the light-emitting element 23, in which a plurality of openings 321 are formed to respectively expose the first electrodes 431 of the plurality of sub-pixels, so as to define the pixel opening region of each sub-pixel, the light-emitting layer of the sub-pixel is formed in the pixel opening region, and the second electrode 432 is formed into a common electrode (that is, shared by the plurality of sub-pixels).

As illustrated in FIG. 14, the display device 501 further includes an encapsulation layer 33 located between the light-emitting element 23 and the touch sensing structure 502. The encapsulation layer 33 is configured to seal the light-emitting element 23 to prevent external moisture and oxygen from penetrating the light-emitting element 23 and the driving circuit, and causing damage to devices such as the light-emitting element 23. For example, the encapsulation layer 33 may be a single-layer structure or a multi-layer structure, for example, including an organic film, an inorganic film, or a multi-layer structure including the organic film(s) and the inorganic film(s) alternately stacked.

For example, as illustrated in FIG. 14, the display substrate 10 further includes a buffer layer 35 located between the display device 501 and the touch sensing structure 502. For example, the buffer layer 35 is formed on the encapsulation layer 33 to improve the adhesion between the touch sensing structure 502 and the display device 501. For example, the buffer layer 35 may be an inorganic insulating layer. For example, the material of the buffer layer 35 may be silicon nitride, silicon oxide, nitrogen oxide of silicon, or the like. For example, the buffer layer 35 may also include a structure in which the silicon oxide layer(s) and the silicon nitride layer(s) are alternately stacked.

For example, as illustrated in FIG. 14, the display substrate 10 further includes a first insulating layer 441 and a second insulating layer 442, so that the first electrode 431, the first electrode 344, the second electrode 345, and the gate electrode 341 are spaced apart and insulated from each other. For example, in some examples, the display substrate 10 further includes other insulating layers located on the base substrate 100 to further function as, for example, a planarization layer, a buffer layer, or the like.

For example, the first insulating layer 441, the second insulating layer 442, and other insulating layers in the display substrate 10 may be a single-layer structure or a multi-layer structure, for example, including an organic film, an inorganic film, or a multi-layer structure including the organic film(s) and the inorganic film(s) alternately stacked. For example, the materials of the first insulating layer 441, the second insulating layer 442 and other insulating layers in the display substrate 10 may be inorganic insulating materials, such as transparent materials. For example, the inorganic insulating material is an oxide of silicon, a nitride of silicon, or a nitrogen oxide of silicon, such as silicon oxide, silicon nitride, and silicon oxynitride, or an insulating material including a metal nitrogen oxide such as aluminum oxide, titanium nitride, or the like. For example, the materials of the first insulating layer 441, the second insulating layer 442, and other insulating layers in the display substrate 10 may also be organic insulating materials to obtain good bending resistance. For example, the organic insulating material is transparent. For example, the organic insulating material is OCA optical glue. For example, the organic insulating material may include polyimide (PI), acrylate, epoxy resin, polymethylmethacrylate (PMMA), etc.

For example, in the case that there are concave portions in the first insulating layer 441, the second insulating layer 442, the pixel definition layer 322, the encapsulation layer 33, the buffer layer 35, or other insulating layers in the display substrate 10, the risk of short circuit between adjacent signal lines or conductive structures can be reduced or avoided by adjusting the distance between adjacent signal lines or conductive structures arranged above the concave portions. Thus, the stability and reliability of signal transmission in the display substrate 10 can be improved, and the signal transmission effect is improved, thereby facilitating the optimization of the overall performance of the display substrate 10.

At least one embodiment of the present disclosure further provides an electronic device, and the electronic device includes the display substrate provided in any embodiment of the present disclosure, for example, the display substrate 10 in the above embodiments.

Figure 15:
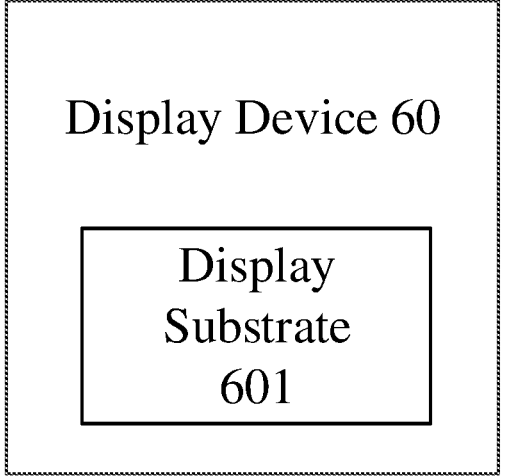
FIG. 15 is a schematic block diagram of an electronic device provided by some embodiments of the present disclosure.

FIG. 15 is a schematic block diagram of an electronic device provided by some embodiments of the present disclosure. For example, as illustrated in FIG. 15, the electronic device 60 includes a display substrate 601. For example, the display substrate 601 may be the display substrate described in any embodiment of the present disclosure, such as the display substrate 10 in the above embodiments.

For example, the display substrate 601 may be a liquid crystal display (LCD) substrate, an organic light-emitting diode (OLED) display substrate, a quantum dot light-emitting diode (QLED) display substrate, an electronic paper display substrate, or other substrates with display functions.

For example, the electronic device 60 may also be a device or apparatus with both the display function and touch function, or in addition to the display function and touch function, the electronic device 60 may also have other required functions according to different actual needs, which is not specifically limited by the embodiments of the present disclosure.

For example, the electronic device 60 may be a display device or a display apparatus with the display function and touch function, for example, it may be used as an on-cell display device or in-cell display device, or may also be other display devices or display apparatuses with the touch function.

The structure, function and technical effect of the electronic device provided by the above embodiments of the present disclosure may refer to the corresponding contents in the display substrate provided by the above embodiments of the present disclosure, and will not be repeated here.

For example, the electronic device provided by the embodiments of the present disclosure may be any product or component with the display function or with both the display function and touch function, such as a display substrate, a display panel, a touch substrate, a touch panel, a touch display substrate, a touch display panel, an electronic paper, a mobile phone, a tablet computer, a television, a display, a notebook computer, a digital photo frame, a navigator, etc., which is not limited by the embodiments of the present disclosure.

For the present disclosure, the following statements should be noted.

(1) The accompanying drawings related to the embodiment(s) of the present disclosure involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should be understood that, in the case that a component such as a layer, a film, a region, a substrate, or the like is referred to be "on" or "under" another component, the component may be "directly" "on" or "under" the another component, or an intermediate component may be disposed therebetween.

(3) In case of no conflict, the embodiments of the present disclosure and features in one embodiment or in different embodiments can be combined to obtain new embodiments.

What have been described above merely are specific implementations of the present disclosure, and the protection scope of the present disclosure is not limited thereto. The protection scope of the present disclosure should be based on the protection scope of the claims.

What is claimed is:

1. A display substrate, comprising:
   a base substrate; and

24 an insulating layer and a conductive layer, which are on the base substrate and stacked with each other,
wherein the conductive layer is on a side of the insulating layer away from the base substrate;
the insulating layer comprises at least one concave portion extending along a first direction;
the conductive layer comprises a plurality of signal lines, the plurality of signal lines comprise a first signal line and a second signal line which are adjacent to each other and arranged side by side, and the first signal line and the second signal line are spaced apart and insulated from each other;
the first signal line comprises a first overlapping portion, and the first overlapping portion at least partially overlaps with the concave portion in a direction perpendicular to the base substrate; and
a distance between the first overlapping portion and the second signal line is greater than or equal to a preset distance, and the preset distance is greater than or equal to ½ of a line width of the first overlapping portion.

2. The display substrate according to claim 1, wherein the preset distance is greater than or equal to 3 times a height of the concave portion in the direction perpendicular to the base substrate.

3. The display substrate according to claim 1, wherein the preset distance is greater than or equal to ½ of a width of the concave portion in a direction perpendicular to the first direction.

4. The display substrate according to claim 1,
wherein a width of the concave portion in a direction perpendicular to the first direction ranges from 5 μm to 15 μm,
a height of the concave portion in the direction perpendicular to the base substrate ranges from 1 μm to 3 μm,
a drop angle of the concave portion in the direction perpendicular to the base substrate ranges from 30° to 50°, and
the line width of the first overlapping portion ranges from 5 μm to 15 μm.

5. The display substrate according to claim 1, wherein in the direction perpendicular to the base substrate, the second signal line does not overlap with the concave portion.

6. The display substrate according to claim 5, wherein an orthographic projection of the first overlapping portion on the base substrate is within a region surrounded by an orthographic projection of the concave portion on the base substrate in a direction perpendicular to the first direction.

7. The display substrate according to claim 5, wherein the concave portion comprises a first edge and a second edge which are opposite to each other and respectively extend along the first direction;
in the direction perpendicular to the base substrate, the first signal line overlaps with the first edge of the concave portion and does not overlap with the second edge of the concave portion; and
an orthographic projection of the second signal line on the base substrate is on a side of an orthographic projection of the second edge on the base substrate away from an orthographic projection of the first edge on the base substrate.

8. The display substrate according to claim 5, wherein the first overlapping portion extends along the first direction.

9. The display substrate according to claim 1, wherein the first signal line further comprises a first main portion, the first main portion does not overlap with the concave portion in the direction perpendicular to the base substrate, and a distance between the first overlapping portion and the second signal line is greater than or equal to a distance between the first main portion and the second signal line.

10. The display substrate according to claim 9, wherein a line width of the first main portion is greater than the line width of the first overlapping portion.

11. The display substrate according to claim 10, wherein in the first signal line, the line width of the first main portion gradually decreases along a direction close to the first overlapping portion.

12. The display substrate according to claim 9, wherein the second signal line comprises a plurality of portions with different line widths to allow the distance between the first overlapping portion and the second signal line to be greater than the distance between the first main portion and the second signal line.

13. The display substrate according to claim 9, wherein the second signal line comprises a second overlapping portion and a second main portion, the second overlapping portion at least partially overlaps with the concave portion in the direction perpendicular to the base substrate, the second main portion does not overlap with the concave portion in the direction perpendicular to the base substrate, and a distance between the second overlapping portion and the first signal line is greater than or equal to a distance between the second main portion and the first signal line.

14. The display substrate according to claim 13, wherein a line width of the second main portion is greater than a line width of the second overlapping portion.

15. The display substrate according to claim 14, wherein in the second signal line, the line width of the second main portion gradually decreases along a direction close to the second overlapping portion.

16. The display substrate according to claim 9, wherein the first overlapping portion and the second overlapping portion respectively extend along a second direction different from the first direction.

17. The display substrate according to claim 1, wherein the at least one concave portion comprises a plurality of concave portions, and the first overlapping portion overlaps with the plurality of concave portions in the direction perpendicular to the base substrate.

18. The display substrate according to claim 1, wherein the display substrate comprises a functional region and a peripheral region at least partially surrounding the functional region, the first signal line and the second signal line are in the peripheral region and at least partially surround the functional region, the first signal line and the second signal line are configured to transmit different electrical signals for the functional region, respectively, and the first signal line is on a side of the second signal line away from the functional region.

19. The display substrate according to claim 18, wherein the functional region is configured to be a touch region, and the first signal line and the second signal line are configured to transmit a touch driving signal and a touch sensing signal for the touch region, respectively.

20. The display substrate according to claim 18, wherein the plurality of signal lines further comprise a third signal line, the third signal line and the first signal line are adjacent to each other and arranged side by side, and the third signal line is on a side of the first signal line away from the second signal line; and the third signal line is on a side of the first signal line and the second signal line away from the functional region, and a distance between the first overlapping portion and the third signal line is greater than the distance between the first overlapping portion and the second signal line.

* * * * *